United States Patent
Battersby

(10) Patent No.: US 6,380,009 B1
(45) Date of Patent: Apr. 30, 2002

(54) METHOD OF MANUFACTURING THIN FILM TRANSISTORS

(75) Inventor: Stephen J. Battersby, Haywards Heath (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/535,593

(22) Filed: Mar. 27, 2000

(30) Foreign Application Priority Data

Mar. 27, 1999 (GB) .............................. 9907019

(51) Int. Cl.$^7$ .............................................. H01L 21/00
(52) U.S. Cl. ........................................ 438/161; 438/160
(58) Field of Search .............................. 438/142, 144, 438/149, 151, 159, 160, 161, FOR 360

(56) References Cited

U.S. PATENT DOCUMENTS

| | | | | |
|---|---|---|---|---|
| 4,738,749 A | * | 4/1988 | Maurice et al. | 156/652 |
| 5,597,747 A | * | 1/1997 | Chen | 438/30 |
| 5,605,845 A | | 2/1997 | Young | 437/21 |
| 5,817,548 A | | 10/1998 | Noguchi et al. | 438/160 |
| 5,981,317 A | * | 11/1999 | French et al. | 438/161 |

FOREIGN PATENT DOCUMENTS

| | | | | |
|---|---|---|---|---|
| EP | 0413390 A2 | 8/1990 | | G02F/1/136 |
| JP | 59165459 | 9/1984 | | H01L/29/78 |
| JP | 6347981 | 2/1988 | | H01L/29/78 |
| JP | 1108528 | 4/1989 | | G02F/1/133 |
| JP | 1225363 | 9/1989 | | H01L/29/78 |
| JP | 07022626 | 1/1995 | | H01L/29/786 |
| WO | 9827583 | 6/1998 | | H01L/21/336 |
| WO | WO-99/31720 | * | 6/1999 | H01L/21/205 |

OTHER PUBLICATIONS

Colgan E. G. et al: "Formaation and stability of silicides on polycrystalline silicon" Materials Science and Engineering R: vol. 16, No. 2, Feb. 1, 1996 pp. 43–96.

* cited by examiner

Primary Examiner—Charles Bowers
Assistant Examiner—Brook Kehede
(74) Attorney, Agent, or Firm—Aaron Waxler

(57) ABSTRACT

A method of manufacturing a top-gate self-aligned thin film transistor involves the use of back exposure of a negative resist (26) using the lower source and drain electrode pattern (11, 12) as a photomask. A transparent amorphous silicon layer (24) is used as the gate electrode layer of the TFT structure, and the resistance of this gate electrode layer (24) is reduced by subsequent processing. For example, a silicide layer (32) may be formed over the gate electrode layer (24) which has the added advantage of reducing the transparency of the insulated gate structure (22, 24) of the TFT, thereby reducing the dependency of the TFT characteristics on light conditions.

7 Claims, 2 Drawing Sheets

METHOD OF MANUFACTURING THIN FILM TRANSISTORS

FIELD OF THE INVENTION

This invention relates to thin film transistors (hereinafter termed TFTs), particularly to top-gate self-aligned TFTs. Such transistors may be used, for example, in active-matrix liquid-crystal displays, or other large-area electronic devices. The invention relates principally to methods of manufacturing such transistors.

BACKGROUND OF THE INVENTION

There is much interest in developing thin-film circuits including TFTs on insulating substrates for large-area electronics applications. For example, TFTs fabricated with portions of an amorphous or polycrystalline semiconductor film may form the switching elements in a matrix of liquid crystal display pixels or in a large-area image sensor array.

The present invention is directed to top-gate thin film transistor structures. Compared to a bottom-gate TFT, an important advantage of a top-gate TFT is the ease with which a low resistance gate line can be made with a highly conductive top-gate metal such as aluminium. The gate line resistivity is of particular importance when considering the performance of amorphous silicon TFTs in order to make them suitable for active-matrix addressing of large, high resolution displays. Also of importance is the ability to form a self-aligned TFT structure. Such a structure reduces the parasitic source-drain capacitance and improves the large area uniformity of the residual capacitance.

A known technique for forming a self-aligned top-gate TFT structure involves the use of so-called "back exposure" through the substrate of a negative resist layer, the resist pattern then being used as a mask during subsequent etching to form the gate electrode pattern. JP-A-63-47981 discloses a top-gate thin film transistor manufactured using this method. The lower source and drain electrode pattern must be formed from an opaque material so that the exposure of the negative resist through the substrate is aligned with the spacing between the source and drain electrodes. This gives rise to a self-aligned TFT structure. However, the TFT structure, including the gate electrodes, must be transparent to enable exposure through those layers of the negative resist. It is therefore not possible to use this back exposure technique in conjunction with low resistance metal gate lines, such as aluminium gate lines, which are opaque. JP-A-63-47981 discloses the use of a transparent indium tin oxide (ITO) gate electrode pattern through which exposure of the negative resist can take place.

The transparent ITO gate requires a separate deposition step in a separate system to that used for the TFT stack. For example, the TFT stack may be formed using a PECVD system, whereas the ITO layer will be sputtered.

SUMMARY OF THE INVENTION

According to the present invention, there is provided a method of manufacturing a thin film transistor comprising;

forming a substantially opaque source and drain electrode pattern on a substrate;

depositing a substantially transparent silicon film on the source and drain electrode pattern to provide a transistor body comprising a channel area of the transistor;

depositing a substantially transparent gate insulator layer and a substantially transparent amorphous silicon gate electrode layer over the channel area;

depositing a layer of negative resist over the gate electrode layer;

exposing the layer of negative resist using back exposure through the substrate, thereby defining an exposed region substantially aligned with the spacing between the source and drain electrodes;

removing the unexposed resist layer and the gate electrode layer beneath the unexposed resist layer;

removing the exposed resist layer; and processing the remaining amorphous silicon gate electrode layer to lower its resistance.

The invention enables the use of an amorphous silicon layer to form the gate electrode layer. In the case of an amorphous silicon TFT, this layer can be deposited as part of the TFT in a single run of a PECVD deposition system without breaking the vacuum. The deposition and processing of amorphous silicon layers is already required in the manufacture of the TFT, so that no additional equipment is required and there is almost no change in throughput. The step of processing the amorphous silicon gate electrode layer to lower its resistance enables the gate to function correctly.

A problem with the use of a transparent gate electrode layer in a top-gate TFT is that the transparency gives rise to a high sensitivity of the transistor to light exposure. This may be a particular problem for the use of the TFTs as the switching devices for an array of liquid crystal display pixels or as the switching devices in a large-area image sensor device. However, a transparent gate electrode layer is required to enable back exposure of the negative resist. Preferably, therefore, the processing additionally increases the attenuation of electromagnetic radiation by the gate electrode layer. This enables the amorphous silicon gate electrode layer to be converted into a more opaque layer which acts as a partial light shield for the channel area of the TFT.

For this purpose, the processing step may comprise: depositing a chromium layer over the transistor; reacting the chromium layer to form chromium silicide with adjacent areas of the amorphous silicon gate electrode layer; and removing the unreacted chromium.

The chromium suicide layer reduces the gate contact resistance and also converts the amorphous silicon gate electrode layer into an opaque layer. The chromium silicide layer is self-aligned over the amorphous silicon gate electrode layer. Additional conducting layers may be provided to define upper row (or column) conductors, but these do not need to be aligned accurately with the TFT structure, since they are not performing a light shielding function for the TFTs.

The invention also provides a thin film transistor comprising: substantially opaque source and drain electrodes on a substrate; a silicon transistor body on the source and drain electrodes defining a channel area of the transistor; a gate insulator layer and a gate electrode layer over the channel area, wherein the gate electrode layer comprises a chromium silicide layer.

BRIEF DESCRIPTION OF THE DRAWING

One example of the invention will now be described in detail with reference to the accompanying drawings in which.

Figure 1:
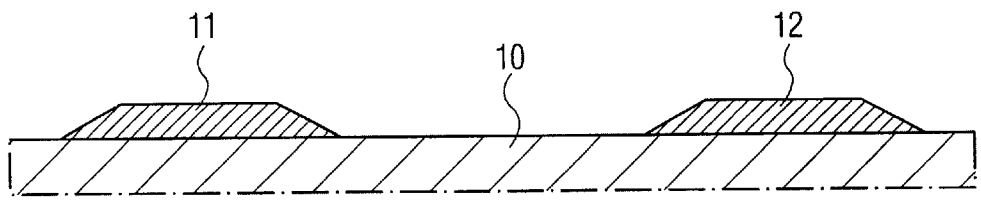
FIGS. 1–6 are cross-sectional views of a self-aligned top-gate TFT at stages in its manufacture by a method in accordance with this present invention.

It should be noted that the figures are diagrammatic and not drawn to scale. Relative dimensions and proportions of

DETAILED DESCRIPTION OF THE PRIMARY EMBODIMENT

The process of the invention comprises the steps of:
a) forming an opaque source and drain electrode pattern 11, 12 on the substrate 10 (FIG. 1),
b) depositing a silicon film 20 on the source and drain electrode pattern 11, 12 to provide the transistor body comprising a channel area of the TFT,
c) forming an insulated gate structure 22, 24 over at least the channel area of the TFT and in which a gate electrode layer 24 comprises amorphous silicon (FIG. 2),
d) depositing a negative resist layer 26 over the insulated gate structure and exposing the negative resist using illumination from the opposite side of the substrate 10 (FIG. 3),
e) removing the unexposed resist and the amorphous silicon gate electrode layer beneath the unexposed negative resist (FIG. 4), and
f) processing the remaining amorphous silicon gate electrode pad to reduce its resistance. This step also preferably improves its light-shielding quality.

In this method in accordance with the invention, the top electrode layer of the insulated gate structure is formed as an amorphous silicon layer, which is sufficiently transparent to the electromagnetic radiation used to expose the selected resist material, but which has a reduced resistance at the end of the manufacturing method to enable the TFT gate to function correctly. The processing performed on the amorphous silicon gate electrode layer preferably also increases its attenuation of that electromagnetic radiation so that the TFT is less responsive to light exposure.

One preferred sequence of processing steps is illustrated in FIGS. 1–6. Using known photolithographic and etching techniques, an electrode pattern 11, 12 of FIG. 1 is formed on the insulating substrate 10 from a film of opaque electrode material deposited on the insulating substrate 10. In the following description and claims, any reference to a transparent layer is intended to indicate a transparency to the wavelength of electromagnetic radiation required to expose the negative resist layer selected for use in the method of the invention (for example ultraviolet). References to an opaque layer are intended to indicate that the layer provides some attenuation of the wavelength of electromagnetic radiation for which the TFT is most sensitive (for example visible light). The reason for this will become apparent from the following description.

An undoped silicon film 20 is then deposited, followed by at least a first insulating film 22, for example of silicon nitride. Subsequently, an amorphous silicon gate electrode layer 24, which will define the upper gate electrode is deposited over the gate insulator layer 22 to define the structure represented in FIG. 2.

The method of the invention is particularly applicable to amorphous silicon TFTs, in which the undoped silicon film 20 comprises amorphous silicon. The amorphous silicon film 20 which forms the channel of the TFT may typically have a thickness of 40 nm, and at this thickness the layer is substantially transparent to ultraviolet light, which is conventionally used for the exposure of resist materials. The silicon nitride gate insulator layer 22 typically has a thickness of around 200 nm, and a layer of this thickness is also substantially transparent to ultraviolet light. Although only a single gate insulator layer has been represented in FIG. 2, a multiple layer gate insulator structure may alternatively be provided.

Although not represented in the figures, the source and drain electrode patterns 11, 12 represented in FIG. 1 may be exposed to a plasma containing phosphorous in order to coat the source and drain with phosphorous before the deposition of the semiconductor layer 20 forming the transistor body. This may be performed by phosphine flash doping in order to improve the ohmic qualities of the contact between the source and drain electrodes 11, 12 and the silicon body of the transistor.

Figure 2:
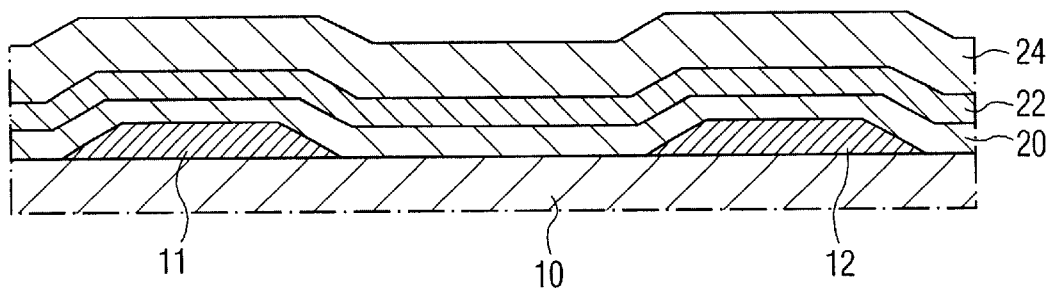
Figure 3:
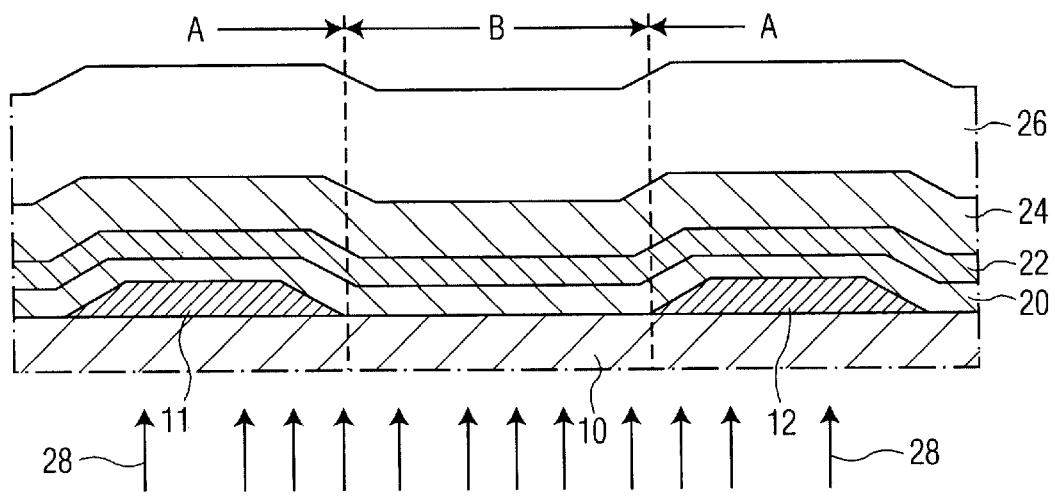

A negative photoresist layer 26 is provided over the TFT structure shown in FIG. 2. The negative photoresist film 26 is selectively exposed by illumination with ultraviolet electromagnetic radiation 28 through the substrate 10 using the opaque areas defined by the source and drain 11, 12 as a photomask. This results in exposure of the region B of the resist layer 26, whereas the regions A remain unexposed. To enable exposure of the region B, the layers of the transistor device beneath the photo resist 26 give rise to a sufficiently low attenuation of the ultraviolet radiation 28 such that the combination of these attenuations is sufficiently low to enable exposure of the photoresist layer 26 to be performed satisfactorily.

By selection of an appropriate etchant, the unexposed regions of the resist film 26 are removed and, either during the same etching step or using a subsequent etching step, the gate electrode layer 24 immediately beneath the unexposed regions A of the resist film 26 is also removed. During the etching of these areas of the gate electrode layer 24, the exposed area B of the resist film 26 acts as a mask, and the structure shown in FIG. 4 results. It may or may not also be desirable to remove the gate insulator layer 22 from areas of the TFT other than that part of the gate insulator layer 22 defining the insulated gate structure. This has not been shown in FIG. 4.

Figure 4:
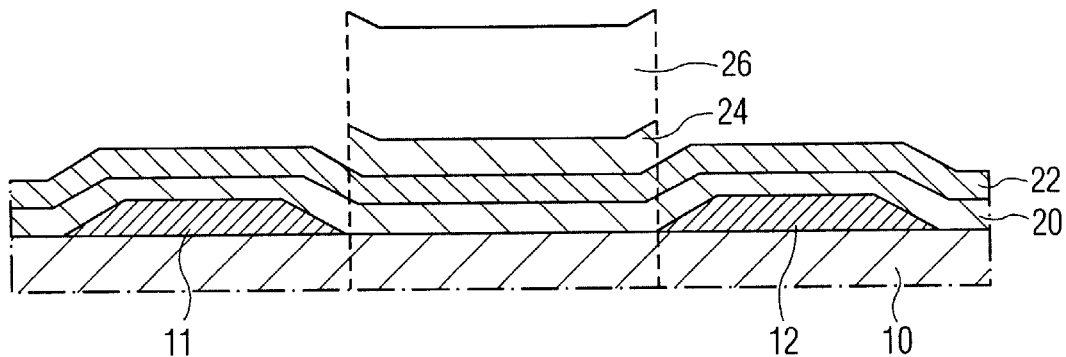

The structure shown in FIG. 4 has a self-aligned insulated top-gate configuration, and the gate electrode is formed from an amorphous silicon film which greatly facilitates the processing operations and reduces the expense in comparison to known top-gate TFT structures which are self-aligned through back exposure. However, the resistance of the amorphous silicon gate electrode layer 24 reduces the performance of the TFT which may provide particular problems if a TFT having the structure shown in FIG. 4 is to be used for large area electronics applications.

The invention therefore provides additional processing of the gate electrode layer 24 to reduce the resistance, and thereby improve the performance of the TFT, to enable use of the device in various applications, such as large area electronics applications.

Although not represented in the drawings, one possible processing stage which can be performed on the amorphous silicon gate electrode layer 24 is to convert the amorphous silicon layer into a polycrystalline silicon layer for example by laser crystallisation. The laser crystallisation process is more effective if the amorphous silicon layer has been previously negatively doped. The resulting polycrystalline silicon layer has greatly reduced resistance, enabling improved TFT performance.

An alternative and preferred processing stage for the amorphous silicon gate electrode layer is described with reference to FIGS. 5 and 6.

Figure 5:
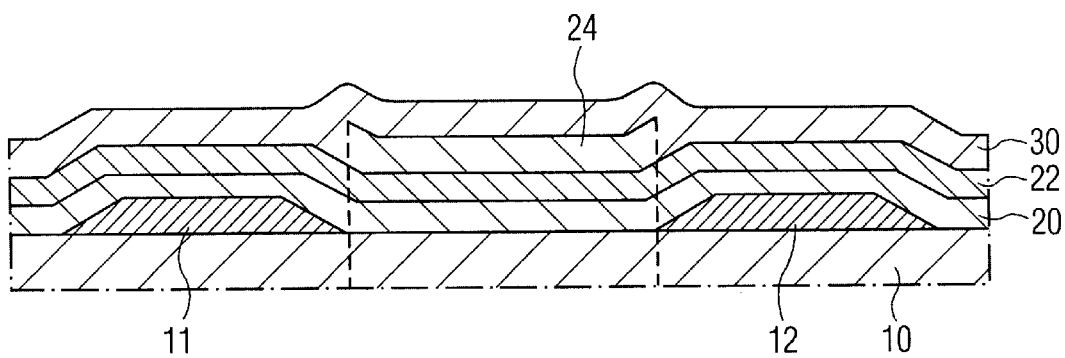
Figure 6:
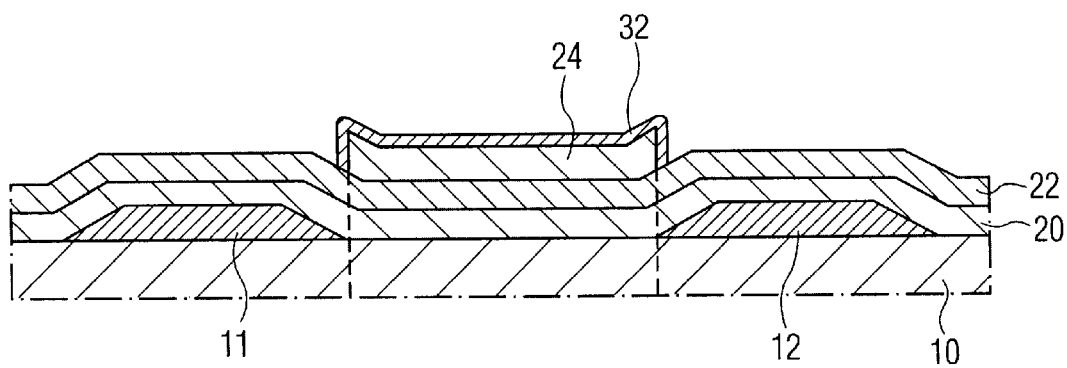

After removal of the remaining exposed part of the resist layer 26, a silicide-forming metal, for example chromium, is deposited over the structure as shown in FIG. 5. The resulting chromium film 30 extends at least over the insulated gate structure 22, 24. A chromium film may be deposited by evaporation or by spluttering, and the thin film structure may then be heated to form a silicide area 32 at the interface between the amorphous silicon gate electrode layer 24 and the chromium layer 30. Subsequently, a chromium etchant is used to remove the unreacted chromium and so as to leave the silicide area 32 as shown in FIG. 6.

This silicide layer 32 reduces the resistance of the gate conductor pattern and also increases the light attenuation of the gate structure, so that the resulting TFT is less susceptible to changes in performance characteristics resulting from changes in ambient light conditions. Amorphous silicon TFT's are most sensitive to visible light so the processing preferably increases the attenuation of visible light. The formation of the silicide layer 32 is also self-aligned with the gate structure.

It has been found that silicide formation can be enhanced by implanting ons through the metallic precursor of the silicide but prior to silicidation. Although chromium has been described as a suitable silicide-forming metal, silicides of other metals may be used in this method, for example Mo, Ni, Bd, Pt, Au, and others.

The gate electrodes may be coupled to row conductors of an array device, and these row conductors will be formed as additional upper layers. However, these do not require accurate alignment with the TFT stacks since they are not required to overlie the TFTs-light shielding has already been achieved. The row conductors can therefore be formed from a highly conductive material (such as Aluminium) without compromising the self-aligned benefits of the TFT structure.

Various additional processing steps which may be employed will be apparent to those skilled in the art, for example the doping of source and drain regions of the transistor body and the use of various additional layers dependent on the particular performance characteristics required for the TFT. Such possibilities will not be described in this application, but many other modifications and variations are possible within the scope of this invention. Similarly, although the use of an amorphous silicon gate electrode layer renders the process of this invention particularly appropriate for amorphous silicon TFTs, the method may equally be employed to polysilicon TFT structures.

What is claimed is:

1. A method of manufacturing a thin film transistor comprising:

forming a substantially opaque source and drain electrode pattern on a substrate;

depositing a substantially transparent silicon film on the source and drain electrode pattern to provide a transistor body comprising a channel area of the transistor;

depositing a substantially transparent gate insulator layer and a substantially transparent amorphous silicon gate electrode layer over the channel area;

depositing a layer of negative resist over the gate electrode layer;

exposing the layer of negative resist using back exposure through the substrate, thereby defining an exposed region substantially aligned with the spacing between the source and drain electrodes;

removing the unexposed resist layer and the gate electrode layer beneath the unexposed resist layer;

removing the exposed resist layer; and processing the remaining amorphous silicon gate electrode layer to lower its resistance.

2. A method as claimed in claim 1, wherein the processing comprises laser crystallisation.

3. A method as claimed in claim 1, wherein the processing additionally increases the attenuation of electromagnetic radiation by the gate electrode layer.

4. A method as claimed in claim 3, wherein the processing step comprises:

depositing a chromium layer over the transistor;

reacting the chromium layer to form chromium silicide with adjacent areas of the amorphous silicon gate electrode layer; and removing the unreacted chromium.

5. A method as claimed in claim 4, wherein the reacting step comprises annealing.

6. A method as claimed in claim 1, wherein a plurality of the transistors are formed on the substrate as switching elements in a device matrix.

7. A method as claimed in claim 1, wherein the source and drain electrode pattern is coated with phosphorous before deposition of the transistor body silicon film.

* * * * *